United States Patent [19]

Kohno

[11] Patent Number: 4,705,940
[45] Date of Patent: Nov. 10, 1987

[54] FOCUS DETECTION IN A PROJECTION OPTICAL SYSTEM

[75] Inventor: Michio Kohno, Tokyo, Japan

[73] Assignee: Canon Kabushiki Kaisha, Tokyo, Japan

[21] Appl. No.: 757,341

[22] Filed: Jul. 22, 1985

[30] Foreign Application Priority Data

Jul. 26, 1984 [JP] Japan .................................. 59-157884

[51] Int. Cl.$^4$ ................................................ G01J 1/20
[52] U.S. Cl. ...................................... 250/201; 250/548
[58] Field of Search ................... 250/201 AF, 201 PF, 250/548, 557; 356/400; 369/44, 45, 46

[56] References Cited

U.S. PATENT DOCUMENTS

| | | | |
|---|---|---|---|
| 4,097,125 | 6/1978 | Suzuki | 350/620 |
| 4,153,371 | 5/1979 | Koizumi et al. | 356/400 |
| 4,525,625 | 6/1985 | Abe | 250/201 |
| 4,541,084 | 9/1985 | Oku et al. | 250/201 |
| 4,595,810 | 6/1986 | Barnes | 250/201 |

Primary Examiner—David C. Nelms
Assistant Examiner—S. Allen
Attorney, Agent, or Firm—Fitzpatrick, Cella Harper & Scinto

[57] ABSTRACT

A projection optical system including a projection optical element for projecting a pattern of a mask onto a wafer, wherein astigmatism is corrected with respect to a predetermined region of a field of the projection optical element and wherein the astigmatism is not corrected with respect to another region of the field of the projection optical element. Also provided is a detector for detecting a state of focus of the projection optical element with respect to the wafer, on the basis of the effect of the astigmatism on a light beam from the region of the field of the projection optical element, in which region the astigmatism is not corrected.

7 Claims, 11 Drawing Figures

FOCUS DETECTION IN A PROJECTION OPTICAL SYSTEM

FIELD OF THE INVENTION AND RELATED ART

This invention relates to focus detection in a projection optical system for projecting a pattern of a first object onto a second object. More particularly, the invention is concerned with focus detection in a projection optical system for projecting a pattern of a photomask or reticle onto a semiconductor wafer in one of the processes of manufacture of semiconductor devices such as integrated circuits.

In semiconductor integrated circuits, there is a tendency to further miniaturization in recent years. Among the processes of manufacture of such semiconductor devices, the most important one is a photo-lithographic process for transferring, onto a semiconductor wafer, a circuit pattern formed on a photomask or reticle (which hereinafter will be referred to simply as "mask"). This photo-lithography is carried out with the use of an apparatus called an exposure apparatus. While various types of exposure apparatuses have already been developed, those using optical exposure systems are now dominant. As for such optical exposure systems, there are contact type exposure systems, proximity type exposure systems, step-and-repeat type exposure systems and mirror projection type exposure systems. The contact type exposure system is one in which the exposure is effected while holding the mask and the wafer in contact with each other. The proximity type exposure system is one in which a minute gap of an order of several tens of microns is maintained between the mask and the wafer and the exposure is effected so that a negative pattern on the mask is printed on the wafer as a positive pattern. The step-and-repeat type exposure system is one in which a reduction lens having a high resolution is used to transfer the pattern of the mask onto the wafer at a reduced scale and the wafer is moved stepwise relative to the mask for each of the exposures. By the repetitions of exposures, the whole surface of the wafer is exposed to the pattern of the mask. The mirror projection type exposure system is one in which a mirror optical system having a high resolution is used. Only such portion of the field of the mirror optical system with respect to which various aberrations are corrected is used for the exposure. While irradiating the mask with an exposure light, the mask and the wafer are moved as a unit relative to the mirror optical system, whereby the entire pattern of the mask is transferred onto the whole surface of the wafer.

Among these optical exposure systems, those using an optical system for forming an image of the mask pattern on the wafer, such as the step-and-repeat type exposure system and the mirror projection type exposure system, require that the wafer be accurately held at the focal point position of the projection optical system composed of lenses or mirrors. Usually, in the exposure apparatuses using such projection type exposure systems, the state of focus of the projection optical system is detected not through the projection optical system. This is called in this Specification an off-axis system. According to this off-axis system, the position at which the image of the mask pattern is expected to be formed is set as a reference and then a minute distance from this reference to the wafer surface is measured. The measurement is carried out by, for example, providing an air flow to the wafer surface. By measuring the back pressure of the air, the distance from the reference to the wafer surface is detected. Alternatively, an electric capacitance defined between the reference and the wafer surface is measured to detect the distance therebetween. As a further alternative, a light beam is inclinedly incident on the wafer surface and the position of the wafer surface is detected on the basis of the amount of deviation of the light beam reflected from the wafer surface. In another case, ultrasonic waves are used to detect the position of the wafer surface.

Such off-axis focus detecting system however involves disadvantages. That is, the focus position of the projection optical system may be displaced due to heat accumulation by the exposure light or due to a variation in ambient temperature. In to the off-axis focus detecting system, such displacement of the focus position of the projection optical system could not be detected. Therefore, if the focus position is displaced, it is difficult to position the wafer exactly at a position at which the mask pattern is exactly imaged. When the focus position of the projection optical system is changed, merely a defocused image of the mask pattern is obtainable on the wafer even though the wafer is moved to the reference position which has been established for the sake of the off-axis type focus detection.

SUMMARY OF THE INVENTION

It is accordingly a primary object of the present invention to provide an arrangement of a projection optical system by which the state of focus of the projection optical system is detected through the same projection optical system.

It is another object of the present invention to provide an arrangement of a projection optical system for projecting a pattern of a mask onto a wafer during the manufacture of semiconductor devices, by which arrangement the state of focus of the projection optical system with respect to the wafer can be accurately detected.

Briefly, according to the present invention, there is provided a projection optical system including a projection optical element for projectig a pattern of a mask onto a wafer, wherein astigmatism is corrected with respect to a predetermined region of a field of the projection optical element and wherein the astigmatism is not corrected with respect to another region of the field of the projection optical element, and a detector is also provided for detecting a state of focus of the projection optical element with respect to the wafer, on the basis of the effect of the astigmatism on a light beam from the region of the field of the projection optical element, in which region the astigmatism is not corrected.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
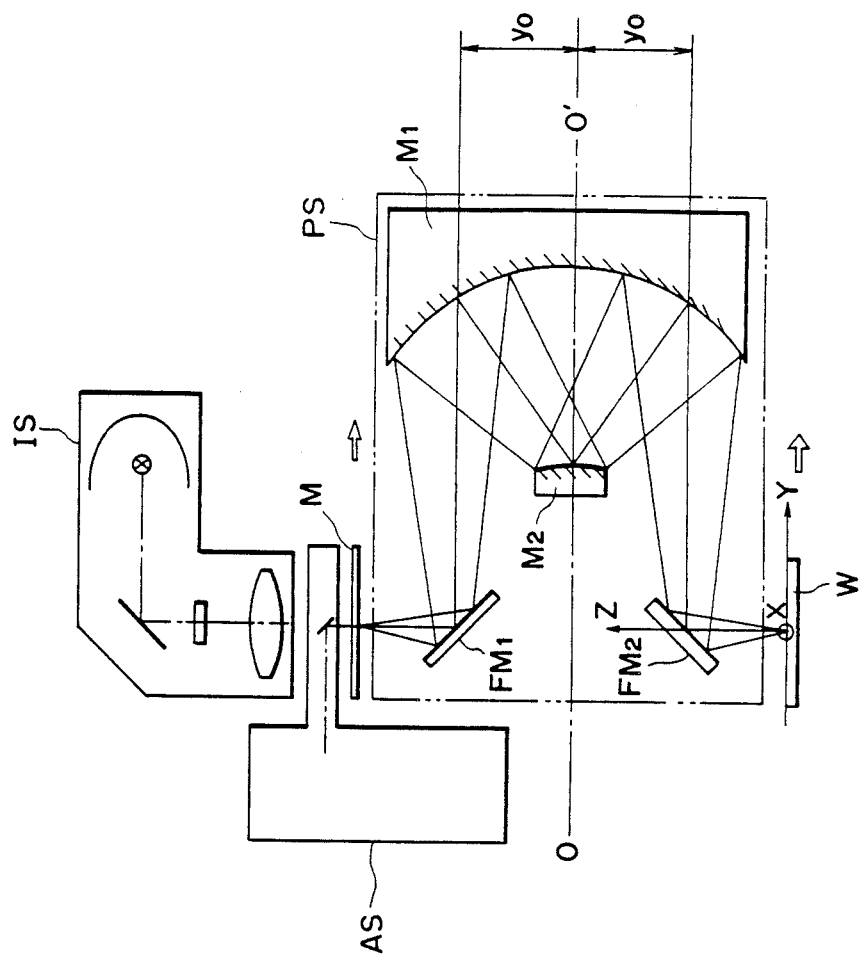
FIG. 1 is a sectional view schematically showing an exposure apparatus of the mirror projection type to which the present invention is applicable.

Referring to FIG. 1, the basic structure of a mirror projection type exposure apparatus, to which the present invention is applicable, will now be described.

As shown in FIG. 1, the exposure apparatus includes a reflection type projection optical system PS which is basically composed of a concave spherical mirror M1 and a convex spherical mirror M2 opposed to each other. These mirrors are arranged so that the light passing through a mask M is reflected three times, i.e. by the concave mirror M1, by the convex mirror M2 and again by the concave mirror M1, whereby the circuit pattern formed on the mask M is imaged on a wafer W at a unit magnification.

The reflection projection optical system PS is symmetrical with respect to an optical axis OO' and aberrations are corrected or suppressed with respect to an image height $y_0$. Thus, during a pattern transfer for transferring the pattern of the mask M onto the wafer W, a superior imaging region corresponding to an arcuate region of a radius $y_0$ is used. In this type of exposure apparatus, and in order to transfer the entire pattern of the mask M onto the whole surface of the wafer W, it is necessary to scanningly move the mask M and the wafer W as a unit relative to the projection optical system PS. To facilitate such scanning movement, two flat mirrors FM1 and FM2 are employed to bend the optical path. These flat mirrors FM1 and FM2 are arranged such that a light beam emitted from a point on the mask M is reflected by the flat mirror FM1, reflected by the concave mirror M1, reflected by the convex mirror M2 having an aperture stop function, reflected again by the concave mirror M1 and finally reflected by the flat mirror FM2, whereby it is focused on a point on the wafer W.

Figure 2:
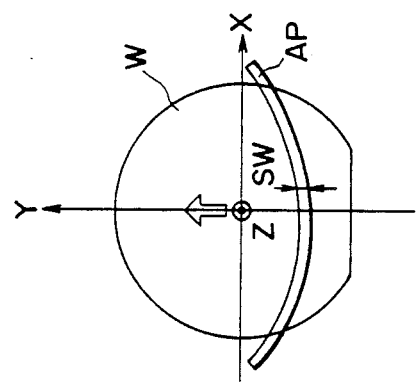
FIG. 2 is a schematic view showing the relation between the wafer surface and the exposure area at one moment during scanning exposure.

In order to positively define the arcuate superior imaging region, an aperture plate (not shown in the drawings) having an arcuate aperture is disposed above the mask M which aperture is effective to limit or sharply define exposure area of arcuate shape. In FIG. 2, reference character AP denotes such an arcuate aperture as projected onto the wafer W surface. Thus, the region of the arcuate aperture AP corresponds to the above-described arcuate superior imaging region and, therefore, corresponds to an exposure area at a moment during scanning exposure of the wafer W. In this manner, at each moment during the scanning exposure an image of such portion of the mask M is formed on the wafer W, which portion is determined by the arcuate aperture AP corresponding to the superior imaging region of the projection optical system PS (in this region, the aberrations are corrected). Thus, for the exposure of the entire wafer surface, the mask M and the wafer W are moved as a unit in the direction of an arrow, i.e. in the Y direction, whereby the entire pattern of the mask M is transferred onto the whole surface of the wafer W.

The region on the mask M corresponding to the arcuate aperture AP is illuminated by an illumination system IS (FIG. 1) which includes a light source supplying deep untraviolet rays, a condenser, a collimator, etc. An alignment optical system AS functions to detect the alignment between the mask M and the wafer W in the X-Y plane. Since the illumination system IS and the alignment optical system AS are of well-known type, detailed description thereof will be omitted here only for the sake of simplicity of explanation.

While, in general, a sagittal image surface and a meridional image surface of an optical system deviate from each other by a greater amount with increase in the distance from the optical axis, i.e. with the increase in the image height, the reflection projection optical system PS disclosed herein is arranged such that the sagittal image surface and the meridional image surface coincides with each other at a predetermined image height ($y=y_0$). Such method of correcting the aberration is described in U.S. Pat. No. 4,097,125.

Figure 3:
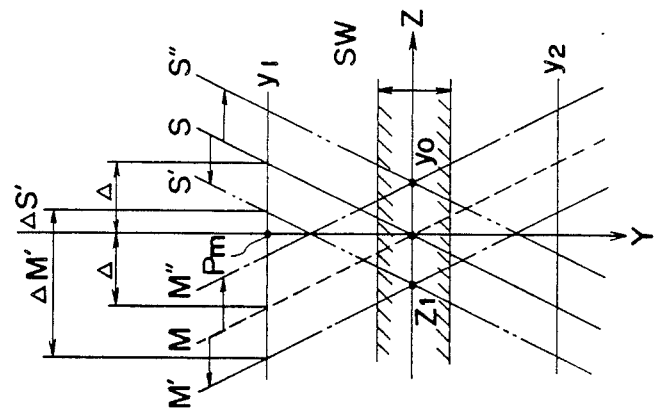
FIG. 3 shows the effect of astigmatism on the focus deviation.

In the neighborhood of the image height $y=y_0$, the sagittal image surface and the meridional image surface have the forms of two inclined lines S and M intersecting with each other, such as shown in FIG. 3. Reference character Z denotes the direction of the optical axis which is perpendicular to the X-Y plane. Actually, for the exposure, a range SW having a width of approx. 1 mm, or two or three times larger, on each of the sides of the best image height $y_0$ is used. Since the projection optical system is symmetrical with respect to the optical axis OO' as described in the foregoing, actually the range SW is of arcuate shape.

The present invention, in one aspect thereof, aims at detecting the state of focus of such projection optical system, particularly through the same projection system.

It is now assumed that the wafer surface W is located in the optimum imaging plane of the projection optical system PS with respect to the mask M and that a point pattern Pw (see FIG. 6) is formed on the wafer W surface at a position $y_1$ more remote from the optical axis than the best image height $y_0$, i.e. $y_1 > y_0$. Since the projection optical system PS has a unit magnification, an image of the point pattern Pw is formed on the lower surface of the mask M at a position Pm having the same image height $y_1$. Since, with respect to the image height $y_1$, the focus of the sagittal image surface and the focus of the meridional image surface are deviated from an image plane passing through the point Pm (i.e. the plane of the lower surface) by substantially the same amount Δ and in the opposite directions (see FIG. 3), the image of the point pattern Pw formed at the point Pm on the lower surface of the mask M is defocused uniformly, so that a blurred image of substantially circular shape such as shown at Pm in FIG. 4B is obtainable on the lower surface of the mask M.

Next, it is now assumed that the wafer W surface is out of the imaging plane of the projection optical system PS with respect to the mask M. That is, if, for example, the wafer W surface is displaced to a position corresponding to a point Z1 (FIG. 3) so that a sagittal image surface S' and a meridional image surface M' are newly established in place of the sagittal and meridional image surfaces S and M, respectively, then the amount of deviation $\Delta S'$ of the sagittal image surface S' with respect to the point Pm on the lower surface of the mask M differs from the amount of deviation $\Delta M'$ of the meridional image surface M' with respect to the same point Pm on the lower surface of the mask M. Therefore, the point pattern Pw on the wafer W is imaged at the point Pm on the lower surface of the mask M as a blurred image of elliptical shape, such as shown in FIG. 4A, having its major axis extending vertically as viewed in this Figure.

Figures 4A, 4B, 4C:
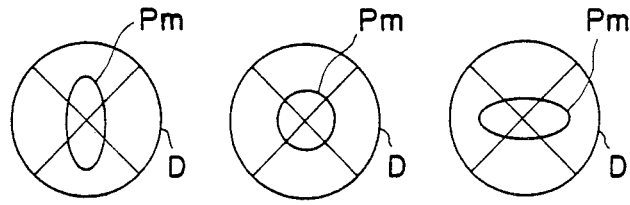
FIGS. 4A-4C show the principle of the detection of focus error, in accordance with the present invention.

If, on the other hand, the wafer W surface is displaced in the opposite direction so that a sagittal image surface S'' and a meridional image surface M'' are newly established, the point pattern Pw on the wafer W surface is imaged on the lower surface of the mask M as a blurred image Pm of elliptical shape, such as shown in FIG. 4C, having its major axis extending horizontally as viewed in this Figure.

It is clear from the above that the point pattern Pw on the wafer W surface is imaged as a uniformly or circularly defocused image Pm (FIG. 4B) where the projection optical system PS is in a state of in-focus with respect to the wafer W surface, while it is imaged as a non-uniformly or elliptically defocused image where the projection optical system PS is out of the in-focus state with respect to the wafer W surface, the major and minor axes of the ellipsoid being interchangeable depending on the direction of deviation of the focus.

Figure 5:
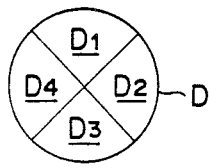
FIG. 5 is a plan view showing an example of a light-receiving element used in the present invention.
Figure 6:
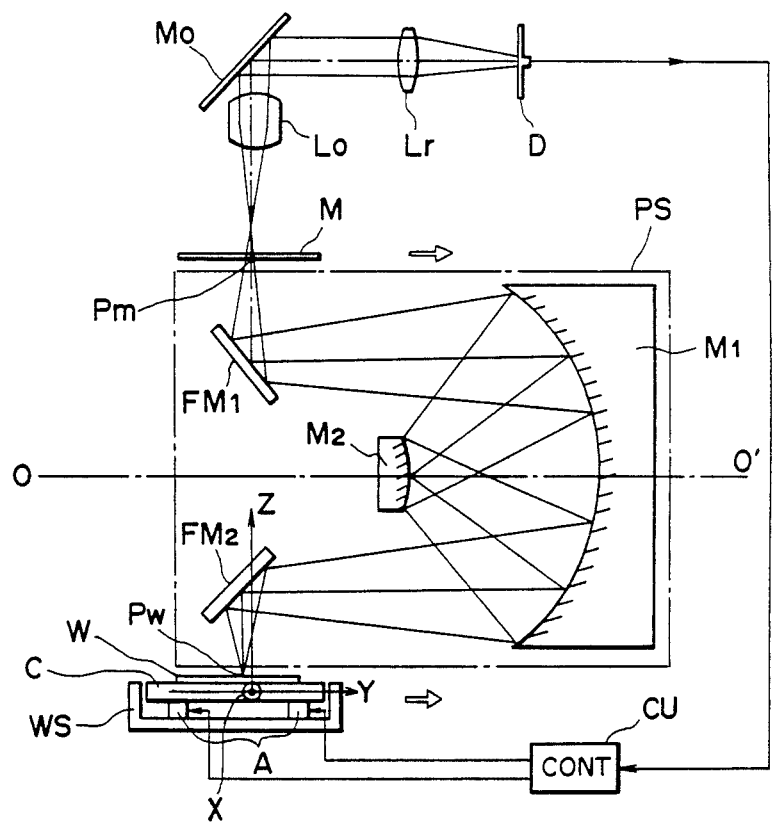
FIG. 6 is a sectional view schematically and diagrammatically showing an embodiment of a mirror projection type exposure apparatus to which the present invention is applied.

The present invention is based on this finding. That is, according to the present invention, the difference in the manner and/or the degree of the blur of the image Pm due to the effect of the astigmatism is utilized for the sake of detection of the state of focus of the projection optical system PS. More particularly, in accordance with one embodiment of the present invention, a light-receiving element D such as shown in FIG. 6, for example, is used to detect the state of the image blur to thereby detect the state of focus of the projection optical system. In one preferred form, the light receiving element D has a light-receiving surface which is disposed in a plane equivalent to or optically conjugate with the lower surface of the mask M. By this, the point pattern Pw on the wafer W is imaged on the light-receiving surface of the light-receiving element D. As shown in FIG. 5, the light-receiving surface of the light-receiving element D according to one embodiment of the present invention is divided into four light-receiving sections D1–D4. Thus, the state of image blur is detected by effecting the following equation:

$$P0=(P1+P2)-(P2+P4)$$

where:
P0=the output of the light-receiving element D;
P1=the output of the section D1;
P2=the output of the section D2;
P3=the output of the section D3; and
P4=the output of the section D4.

If the output P0 is equal to zero, it shows that the projection optical system is in-focus with respect to the wafer W surface. If, on the other hand, the output P0 is positive or negative, it shows that the projection optical system is out of the in-focus state. The light-receiving element D may be provided by a linear solid-state image-pickup sensor device such as a charge coupled device wherein added outputs with respect to the horizontal direction and the vertical direction are compared with each other. Any other suitable detecting means is of course usable.

FIG. 6 shows an embodiment of an exposure apparatus of mirror projection type to which the focus detecting principle according to the present invention is applied. The same reference characters as in the FIG. 1 arrangement are assigned to the elements having corresponding functions.

As shown in FIG. 6, the exposure apparatus includes a reflection projection optical system PS in which the astigmatism is corrected or suppressed such that the sagittal image surface and the meridional image surface intersects with each other at a predetermined image height $y_0$, as in the arrangement of FIG. 1. By this projection optical system PS, the pattern formed on a mask M is transferred onto a wafer W. A point pattern Pw, as described in the foregoing, is formed on the wafer W surface at a position having an image height $y_1$ (see FIG. 3) which position is slightly spaced from a position at which the image of a portion of the mask M is projected. In other words, the point pattern Pw is formed at the image height position $y_1$ which is spaced from the origin (Z-axis) of the X-Y co-ordinates by a distance equal to a radius $y_0$.

The reflection projection optical system PS has a unit magnification. Thus, if the mask M and the wafer W are held in an optically conjugate relation with respect to the projection optical system PS, i.e. if the mask M and the wafer W are positioned so that the circuit pattern formed on the mask M can be exactly focused on the wafer W surface, the point pattern Pw formed on the wafer W surface is imaged on the lower surface of the mask M, at a position deviated from the origin (Z-axis) by the same distance $y_1$, as an image Pm. The image Pm formed on the lower surface of the mask M is blurred uniformly or circularly, such as shown in FIG. 4B, due to the astigmatism.

As shown in FIG. 6, along the optical path passing through the position at which the image Pm is formed, there are disposed an objective lens Lo, a path-bending mirror Mo, an imaging lens Lr and a light-receiving element D. The light-receiving element D has a light-receiving surface which is divided into four light-receiving sections D1–D4, as shown in FIG. 5. As has already been described with reference to FIGS. 4A and 4C, elliptically defocused images Pm, which are caused by the astigmatism when the projection optical system PS is out of the in-focus state, have their major and minor axes extending vertically and horzontally as viewed in these Figures. In view of this, the light-receiving surface of the light-receiving element D is divided by two orthogonally intersecting lines each of which is inclined with an angle 45 degrees, as viewed in FIG. 5, relative to the major and minor axes of the ellipsoid Pm, to thereby assure correct detection of the ellipsoid. The objective lens Lo and the imaging lens Lr are effective to establish an optically conjugate relation between the mask M and the light-receiving element D. In FIG. 6, the objective lens Lo and the optical elements following it are illustrated on an enlarged scale, for the sake of clarification.

A wafer stage WS has a chuck C for holding the wafer W by vacuum suction. The chuck C is supported by a vertical fine adjuster A which is composed, for example, of a stack of piezo-electric elements. A control unit CU is connected between the light-receiving element D and the adjuster A and is arranged to displace the chuck C upwardly or downwardly in the Z direction in response to an output from the light-receiving element D.

In operation, an unshown illumination system or an unshown light source disposed above the mirror Mo supplies a light beam to the mask M through the mirror Mo. Preferably, such light beam has a wavelength which does not sensitize a sensitive layer formed on the wafer W. The light beam incident on the mask M passes therethrough and, by way of the reflection type projection optical system PS, it is incident on the point pattern Pw on the wafer W surface. The light reflected by the point pattern Pw on the wafer W is directed by the projection optical system PS to the mask M, so that an image of the point pattern Pw is formed on the mask M as an image Pm which is blurred due to the astigmatism. Since the light-receiving element D has its light-receiving surface optically conjugate with the mask M, the image Pm is reproduced on the light-receiving element D. If the projection optical system Ps is in the in-focus state with respect to the wafer W, a blurred image Pm having substantially circular shape such as shown in FIG. 4B appears on the light-receiving element D. If, on the other hand, the wafer W is not at the in-focus position of the projection optical system PS, i.e. if the mask M and the wafer W are not optically conjugate with each other with respect to the projection optical system PS, a blurred image Pm having substantially elliptical shape such as shown in FIG. 4A or 4C appears on the surface of the light-receiving element D. From the tendency or characteristics of the astigmatism contained in the projection optical system PS, it is possible to preparatively find the state of image blur and the manner of change of the ellipsoid Pm, to be formed on the surface of the light-receiving element D, in accordance with the direction of deviation from the optically conjugate relation. Therefore, the wafer W can be moved in a particular direction realizing the optically conjugate relation with the mask M. Alternatively, the mask M or the projection optical system PS may be moved.

Four signals from the four light-receiving sections D1-D4 of the light-receiving element D are processed by the control unit CU, e.g. in the manner as described in the foregoing. Since the amount of change of the ellipsoid Pm on the light-receiving element D has a particular relation with the amount of defocus of the projection optical system PS, depending on the astigmatism contained therein, the amount of defocus can be detected from the difference between the light quantities as received by the light-receiving sections D1-D4 of the light-receiving element D. Therefore, by processing the signals from these light-receiving sections D1-D4, the control unit CU produces a signal indicating the direction of displacement to be made by the wafer W and the amount of displacement corresponding to the difference between the light quantities as received by the light-receiving sections D1-D4. In response to this signal, the adjuster A is actuated to displace the wafer W to the designated position.

In the above embodiment, the point pattern Pw formed on the wafer W is detected for the sake of detection of the state of focus of the projection optical system. Since, however, the surface of the wafer W has a mirror function, the state of focus of the projection optical system PS can be detected also in such a case where a point pattern is projected through the mask M onto the wafer W. This will now be described in detail with reference to FIG. 7.

Figure 7:
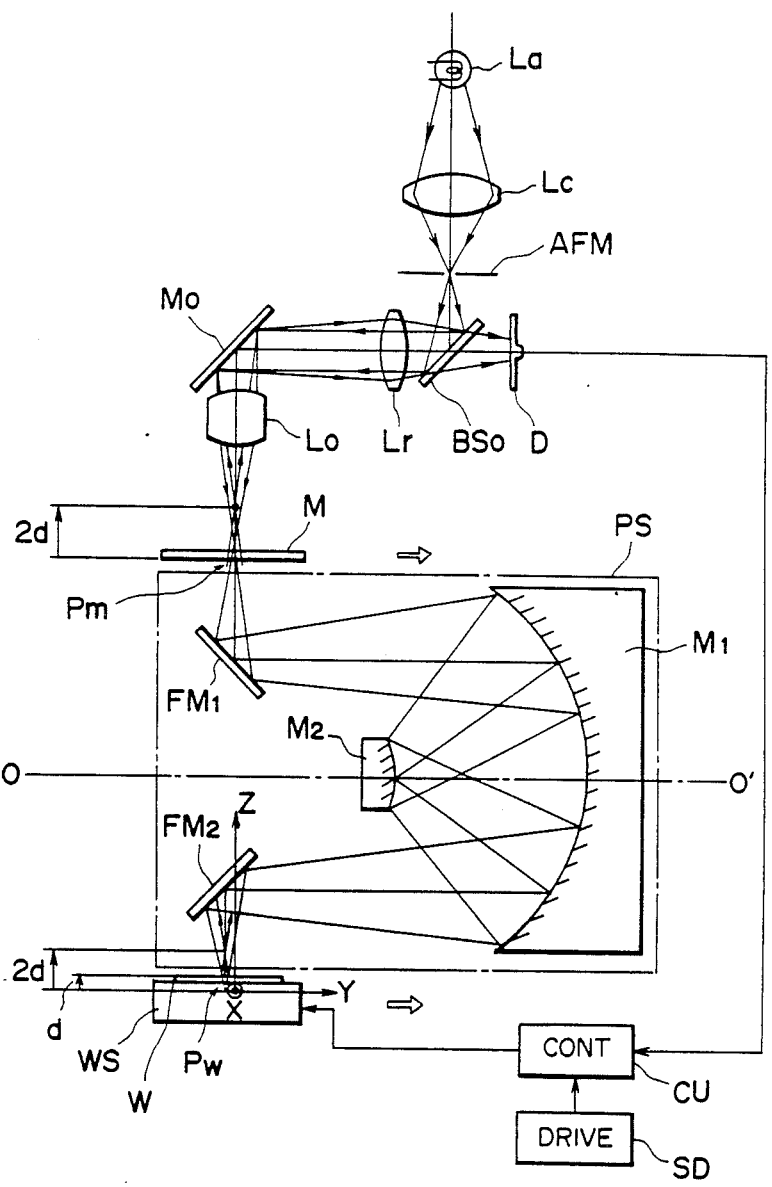
FIG. 7 is a sectional view schematically and diagrammatically showing another embodiment of a mirror projection type exposure apparatus to which the present invention is applied.

FIG. 7 shows another embodiment of a mirror projection type exposure apparatus to which the present invention is applied. The same reference characters as in FIG. 6 are assigned to elements having corresponding functions. In addition to the elements shown in FIG. 6, the FIG. 7 embodiment includes a half mirror BSo which is inclinedly disposed between an imaging lens Lr and a light-receiving element D. Along an optical path which is additionally defined by the provision of the half mirror BSo, a pinhole plate AFM, a condenser lens Lc and an illumination source La are disposed in this order from the half mirror BSo side. The pinhole plate AFM has the function of forming a detection pattern, which is a point pattern similar to that in the foregoing embodiment, and is disposed at a position equivalent to the light-receiving surface of the light-receiving element D with respect to the half mirror BSo.

The light beam emitted from the illumination source La is focused by the condenser lens Lc on the pinhole plate AFM. The light beam passing through the pinhole of the pinhole plate AFM is reflected by the half mirror BSo and transmitted through the imaging lens Lr, mirror Mo, objective lens Lo, and is focused on the mask M. Thereafter, it passes through the mask M and is imaged on the wafer W by the reflection type projection optical system PS. If, at this time, the wafer W is at a position which is deviated from the in-focus position of the projection optical system PS by a distance d, a virtual image of the point pattern is formed, by the mirror function of the wafer W, at a position deviated by an amount 2d, which is twice as large as the amount of actual deviation of the wafer W. Since the light beam divergingly advancing from the virtual image toward the mask M is focused by the projection optical system PS, it is imaged at a position deviated from the mask M by the same distance 2d. This means that the degree of deformation in the ellipsoid which appears on the surface of the light-receiving element D becomes twice as large as that in the FIG. 6 embodiment, and therefore, the sensitivity of detection of the focus error is increased significantly.

Figure 8:
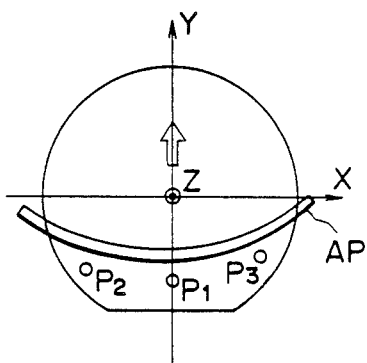
FIG. 8 is a schematic view showing the relation between detection points and the wafer exposure area at one moment during scanning exposure, in accordance with one embodiment of the present invention.

FIG. 8 shows an example where plural detection points are set to detect the state of focus of the projection optical system. As shown in this Figure, plural detection points P1-P3 each corresponding to a point pattern are set at the position few milimeters upstream, with respect to the direction of scanning movement of the wafer W as denoted by an arrow, of the aperture AP in which the image of a portion of the mask M is projected at a moment during scanning exposure. With this arrangement, when the aperture AP is scanningly moved relative to the wafer W for the exposure, the focus error with respect to each portion of the wafer W can be detected just before such portion is exposed to a corresponding portion of the pattern of the mask M. Since the scanning speed and the distance from the center of the arcuate aperture AP to each of the points P1-P3 are determined, the focus error with respect to each portion of the wafer W can be corrected just when such portion reaches the exposure position, that is the position of the aperture AP. More particularly, the information on the scanning speed is supplied to a control unit CU from a drive unit SD for scanningly moving the mask M and the wafer W, and an adjuster (not shown in FIG. 7) is actuated by the control unit CU with a certain time lag.

In a case where plural detection points are established such as shown by P1–P3 in FIG. 8, an average focus error is detectable from the detection results at these detection points. In such case, therefore, the position of the wafer W in the Z direction can be adjusted such that all the portions of the wafer surface are sequentially held within the depth of focus of the projection optical system PS.

Figure 9:
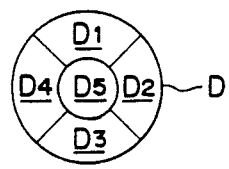
FIG. 9 is a plan view showing another example of a light-receiving element used in the present invention.

With the above-described arrangement, and during scanning movement of the wafer, the focus can be adjusted continuously or intermittently. Therefore, a correct focus can be maintained relative to the whole surface of the wafer.

Where the light-receiving element D is of the type in which the light-receiving surface thereof is divided into plural sections, the light-receiving surface of such light-receiving element may have a central circular region D5, such as shown in FIG. 9, which region corresponds to the blurred image Pm (FIG. 4B) obtainable when the in-focus state of the projection optical system is established. By neglecting an output from such circular central region D5 during processing the signals produced by the plural light-receiving sections, the sensitivity of the detection can be improved. The output produced from the central region D5 is used for the sake of determining whether or not a light beam is correctly incident on the light-receiving element or for the sake of confirmation of the in-focus state of the projection optical system. As a further alternative, such central region of the light-receiving surface of the light-receiving element which corresponds to the blurred image of circular shape (FIG. 4B) obtainable upon establishment of the in-focus state, may be shielded by a masking member. Also this is effective to improve the sensitivity.

While, in the foregoing embodiments, the present invention has been described with reference to a projection optical system which is composed of mirrors, the present invention is applicable also to a projection optical system composed of a lens element or elements if the optical system has a similar astigmatism. Further, the present invention is applicable not only to the focus detection in the exposure apparatus of projection type, but also to a reading device in a video-disk system, an optical writing device, etc.

In accordance with the present invention, as has hitherto been described, the focus of the optical system is detected through the same optical system. Therefore, the focus displacement of the optical system itself can also be detected. Further, any error in the detection which would be caused if the focus of the optical system is detected not through the same optical system can be prevented. As the result, very accurate detection of the focus is attainable. Moreover, the detection of the focus of the optical system is based on the deformation of the image caused by the characteristics of the optical system itself. Accordingly, the arrangement of the detection system is very simple and compact.

Where a reflection type projection optical system is used, no chromatic aberration is caused. Therefore, the design of the projection optical system is not limited even if different wavelengths are used as the focus detecting light and the exposure light.

While the invention has been described with reference to the structures disclosed herein, it is not confined to the details set forth and this application is intended to cover such modifications or changes as may come within the purposes of the improvements or the scope of the following claims.

What is claimed is:

1. A projection apparatus usable with a first object having a pattern and a second object, said apparatus comprising:
   a projection optical system having an imaging plane which includes a first portion wherein aberrations have been corrected in a predetermined manner and a second portion different from said first portion;
   means for transferring the pattern of the first object onto the second object by use of said first portion of said imaging plane of said projection optical system; and
   means for photoelectrically detecting the second object by use of said second portion of said imaging plane of said projection optical system, to detect a positional relation between the second object and said imaging plane of said projection optical system.

2. An apparatus according to claim 1, wherein, in said second portion of said imaging plane of said projection optical system, astigmatism has been corrected relatively insufficiently as compared with correction in said first portion of said imaging plane of said projection optical system.

3. A projection apparatus usable with a first object having a pattern and a second object, said apparatus comprising:
   a projection optical system having an imaging plane which includes a first portion and a second portion different from said first portion;
   means for transferring the pattern of the first object onto the second object by use of said first portion of said imaging plane of said projecion optical system;
   means for adjusting a positional relation between the second object and said imaging plane of said projection optical system;
   means for projecting light upon the second object by use of said projection optical system and through said second portion of said imaging plane of said projection optical system;
   means for photoelectrically detecting light reflected from the second object; and
   means for controlling said adjusting means in accordance with the detection by said detecting means.

4. A projection apparatus usable with a first object having a pattern and a second object, said apparatus comprising:
   a projection optical system having an optical axis and an imaging plane which includes a first portion and a second portion different from said first portion;
   means for transferring the pattern of the first object onto the second object by use of said first portion of said imaging plane of said projection optical system;
   means for projecting light upon the second object through said second portion of said imaging plane of said projection optical system; and
   means for photoelectrically detecting the light from the second object by use of said projection optical system, to detect a positional relation between the second object and said imaging plane of said projection optical system in a direction of the optical axis of said projection optical system.

5. An apparatus according to claim 4, wherein, in said second portion of said imaging plane of said projection optical system, astigmatism has been corrected relatively insufficiently as compared with the correction in said first portion of said imaging plane of said projection optical system.

6. A projection apparatus usable with a first object having a pattern and a second object, said apparatus comprising:
- a projection optical system having an imaging plane which includes a first portion and a second portion different from said first portion;
- means for transferring the pattern of the first object onto the second object by use of said first portion of said imaging plane of said projection optical system;
- means for adjusting a positional relation between the second object and said imaging plane of said projection optical system;
- means for projecting light upon the second object through said second portion of said imaging plane of said projection optical system;
- means for photoelectrically detecting light reflected from the second object; and
- means for controlling said adjusting means in accordance with the detection by said detecting means.

7. A projection apparatus usable with a first object having a pattern and a second object, said apparatus comprising:
- a reflection optical system having an optical axis and an imaging plane;
- means for transferring the pattern of the first object onto the second object by use of said imaging plane of said reflection optical system;
- means for projecting light upon the second object by way of said reflection optical system; and
- means for detecting light reflected from the second object by use of said reflection optical system, to detect a positional relation between the second object and said imaging plane of said reflection optical system in the direction of the optical axis of said reflection optical system.

* * * * *

UNITED STATES PATENT AND TRADEMARK OFFICE
CERTIFICATE OF CORRECTION

PATENT NO. : 4,705,940

DATED : November 10, 1987

INVENTOR(S) : MICHIO KOHNO

It is certified that error appears in the above-identified patent and that said Letters Patent is hereby corrected as shown below:

AT [56] IN THE REFERENCES

"Fitzpatrick, Cella Harper & Scinto" should read --Fitzpatrick, Cella, Harper & Scinto--.

COLUMN 2

Line 16, delete "to".
Line 44, "projectig" should read --projecting--.
Line 49, "element, and a" should read --element. A--.

COLUMN 3

Line 62, "define exposure" should read --define an exposure--.

COLUMN 4

Line 29, "cides" should read --cide--.

COLUMN 6

Line 4, "charge coupled" should read --charge-coupled--.
Line 19, "intersects" should read --intersect--.
Line 55, "horzontally" should read --horizontally--.

UNITED STATES PATENT AND TRADEMARK OFFICE
CERTIFICATE OF CORRECTION

PATENT NO. : 4,705,940

DATED : November 10, 1987

INVENTOR(S) : MICHIO KOHNO

It is certified that error appears in the above-identified patent and that said Letters Patent is hereby corrected as shown below:

COLUMN 8

Line 54, "milimeters" should read --millimeters--.

Signed and Sealed this

Nineteenth Day of July, 1988

Attest:

DONALD J. QUIGG

Attesting Officer      Commissioner of Patents and Trademarks